(12) United States Patent
Hong et al.

(10) Patent No.: US 12,110,421 B2
(45) Date of Patent: Oct. 8, 2024

(54) COMPOSITION FOR SEMICONDUCTOR PROCESSING AND METHOD OF FABRICATING SEMICONDUCTOR DEVICE USING THE SAME

(71) Applicant: SK enpulse Co., Ltd., Gyeonggi-do (KR)

(72) Inventors: Seung Chul Hong, Seoul (KR); Deok Su Han, Seoul (KR); Han Teo Park, Seoul (KR)

(73) Assignee: SK ENPULSE CO., LTD., Gyeonggi-do (KR)

( * ) Notice: Subject to any disclaimer, the term of this patent is extended or adjusted under 35 U.S.C. 154(b) by 0 days.

(21) Appl. No.: 17/570,230

(22) Filed: Jan. 6, 2022

(65) Prior Publication Data

US 2022/0220340 A1 Jul. 14, 2022

(30) Foreign Application Priority Data

Jan. 8, 2021 (KR) .................. 10-2021-0002454

(51) Int. Cl.
*C09G 1/02* (2006.01)
*H01L 21/3105* (2006.01)
*H01L 21/321* (2006.01)

(52) U.S. Cl.
CPC .......... *C09G 1/02* (2013.01); *H01L 21/31053* (2013.01); *H01L 21/3212* (2013.01)

(58) Field of Classification Search
None
See application file for complete search history.

(56) References Cited

U.S. PATENT DOCUMENTS

| 9,505,951 B2* | 11/2016 | Umeda | C09G 1/02 |
| 2013/0313225 A1* | 11/2013 | Jin | C09G 1/02 252/79.4 |
| 2019/0062594 A1* | 2/2019 | Yao | C09K 3/1409 |
| 2019/0080927 A1* | 3/2019 | Izawa | H01L 21/3212 |

FOREIGN PATENT DOCUMENTS

| CN | 104334674 A | 2/2015 |
| JP | 2008-288398 A | 11/2008 |
| JP | 2019-167405 A | 10/2019 |
| KR | 10-2014-0135743 A | 11/2014 |
| WO | 0157919 A1 | 8/2001 |

OTHER PUBLICATIONS

Office Action for the Japanese Patent Application No. 2022-001962 issued by the Japanese Patent Office on Feb. 28, 2023.
Office Action for the Taiwanese Patent Application No. 111100719 issued by the Taiwanese Patent Office on Sep. 2, 2022.
Office Action for the Chinese Patent Application No. 202210009062.3 issued by the Chinese Patent Office on Nov. 28, 2023.
Office Action for Korean Patent Application No. 10-2021-0142531 issued by the Korean Patent Office on Jun. 19, 2024.
Office Action for Chinese Patent Application No. 202210009062.3 issued by the Chinese Patent Office on Jun. 26, 2024.

* cited by examiner

*Primary Examiner* — Shamim Ahmed
(74) *Attorney, Agent, or Firm* — IP & T GROUP LLP

(57) ABSTRACT

Provided is a composition for semiconductor processing including abrasive particles and at least one additive. The composition may exhibit excellent polishing performance by being applied to a process of polishing a semiconductor wafer, may minimize defects in a polishing target surface, may achieve flat polishing without a difference in flatness between a plurality of different layers when used to polish the externally exposed surfaces of the layers, and may be applied to polishing of the surface of a semiconductor wafer having a through silicon via (TSV). Also provided is a method of fabricating a semiconductor device using the composition.

13 Claims, 7 Drawing Sheets

[FIG. 1]
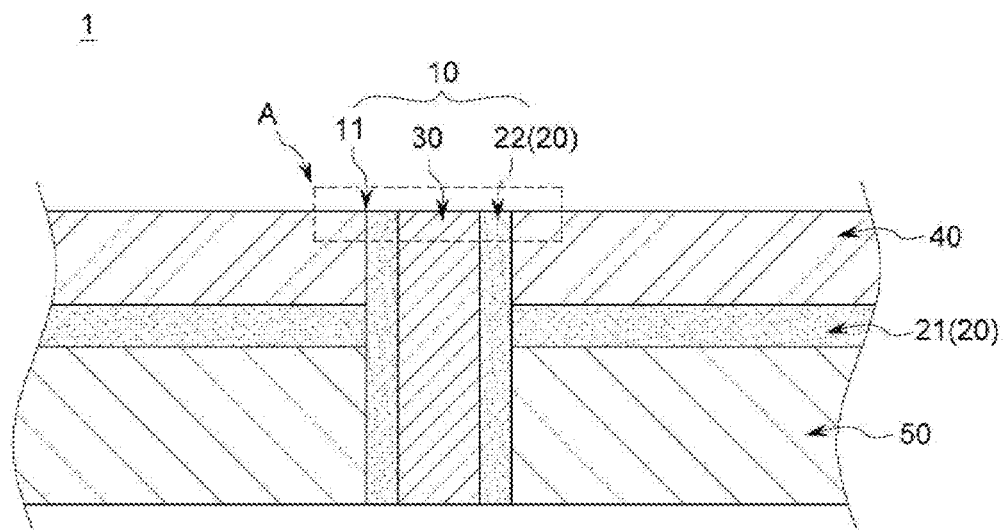
[FIG. 2]
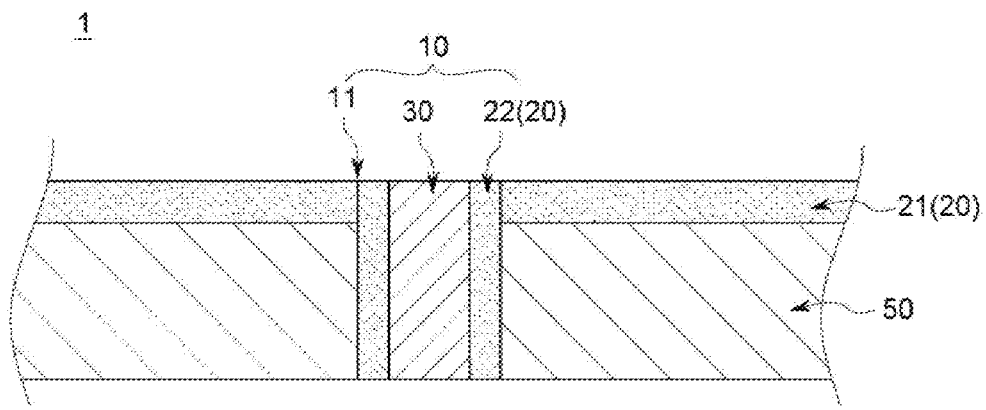

[FIG. 3]
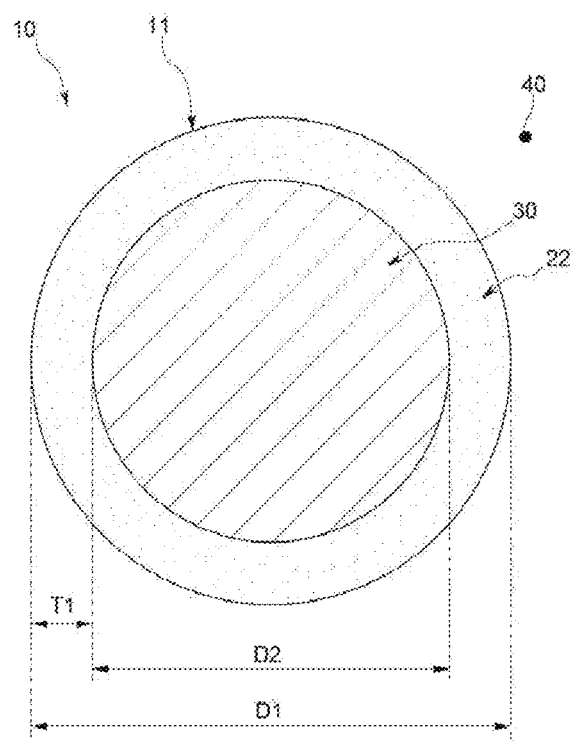

[FIG. 4]
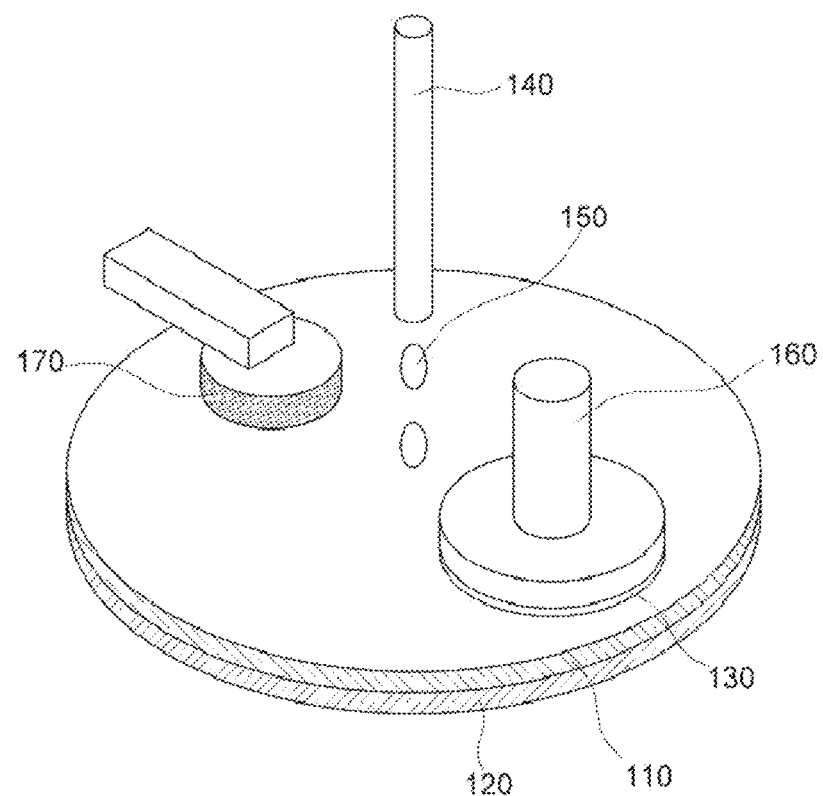

[FIG. 5]
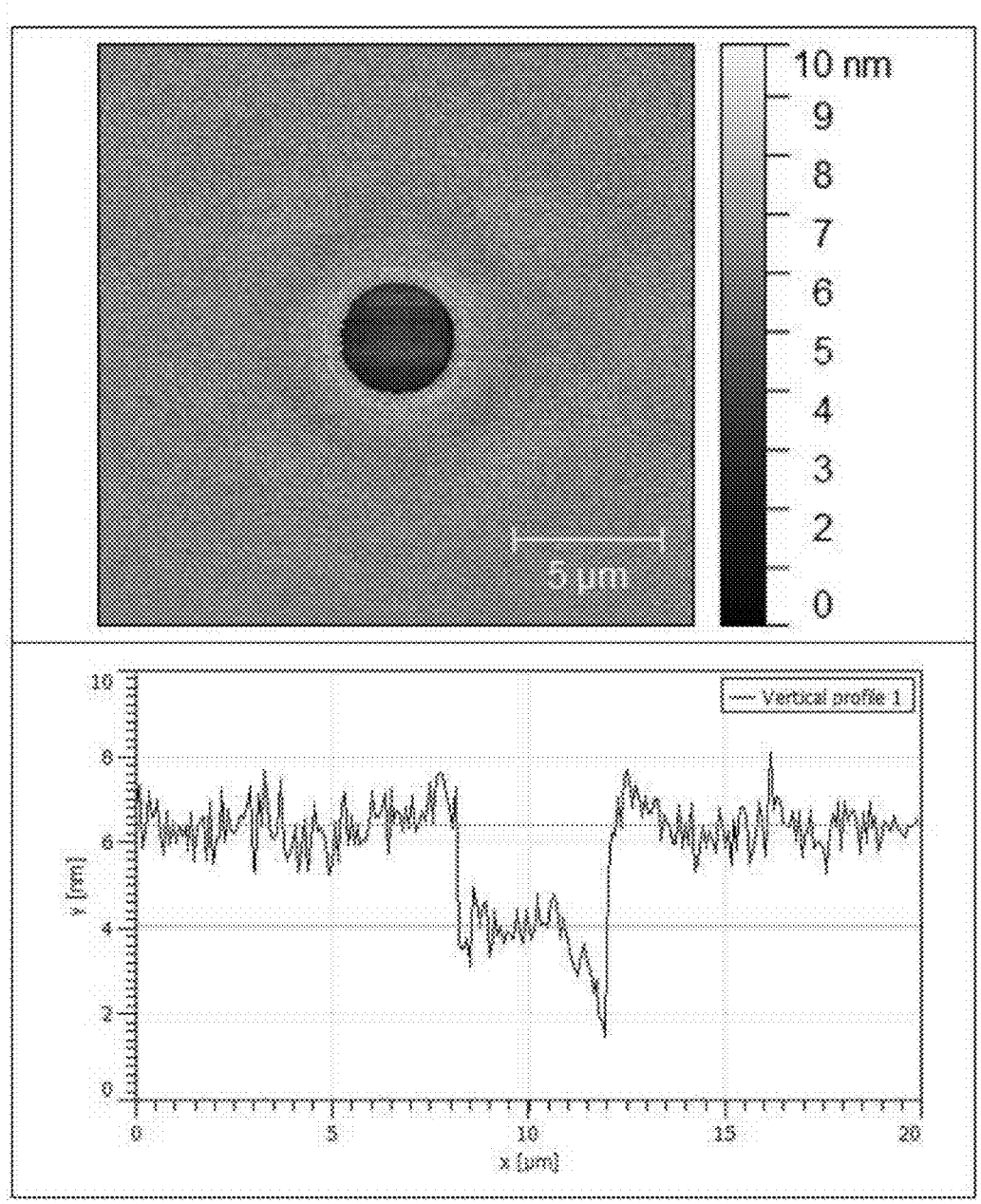

[FIG. 6]
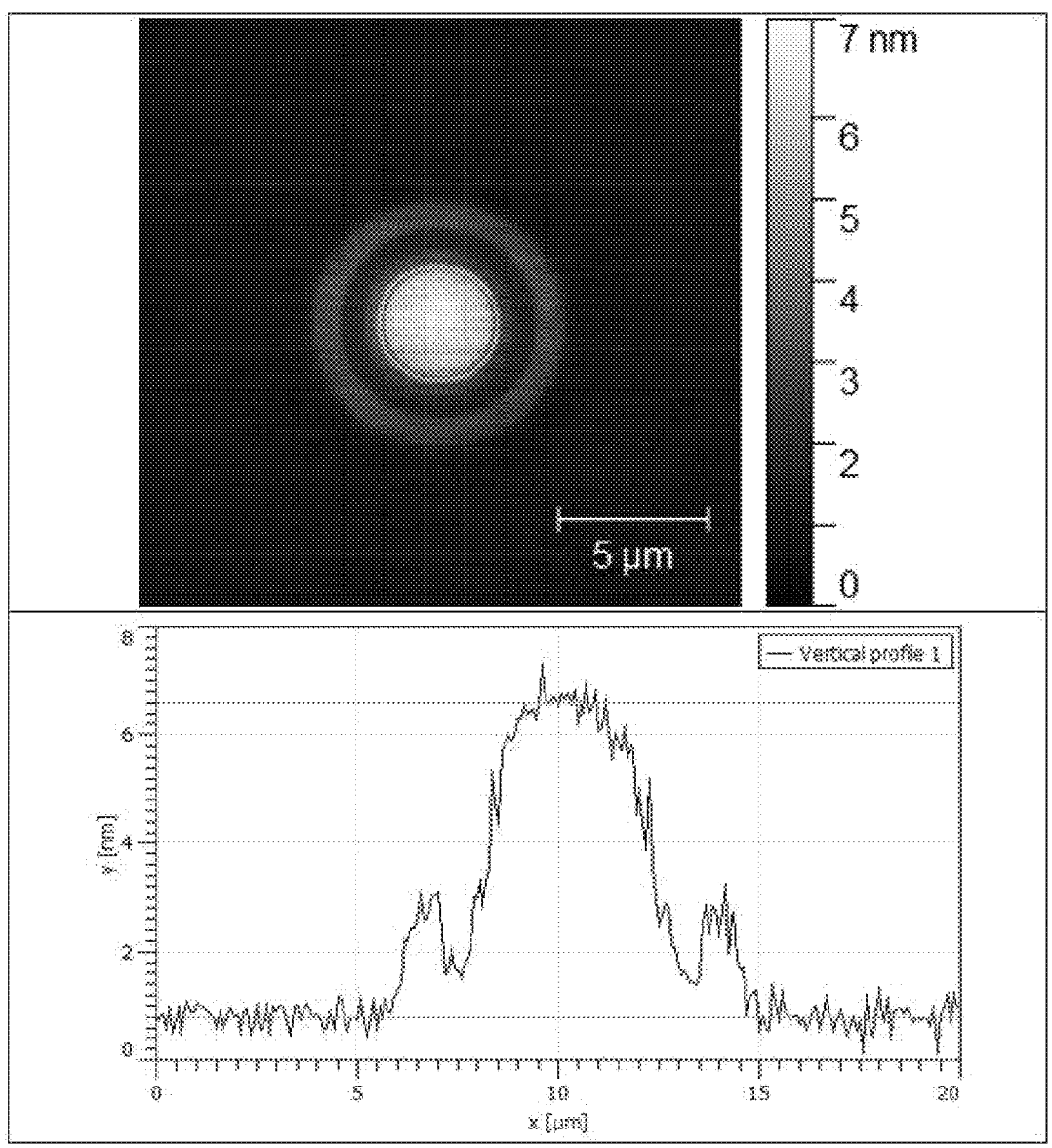

[FIG. 7]
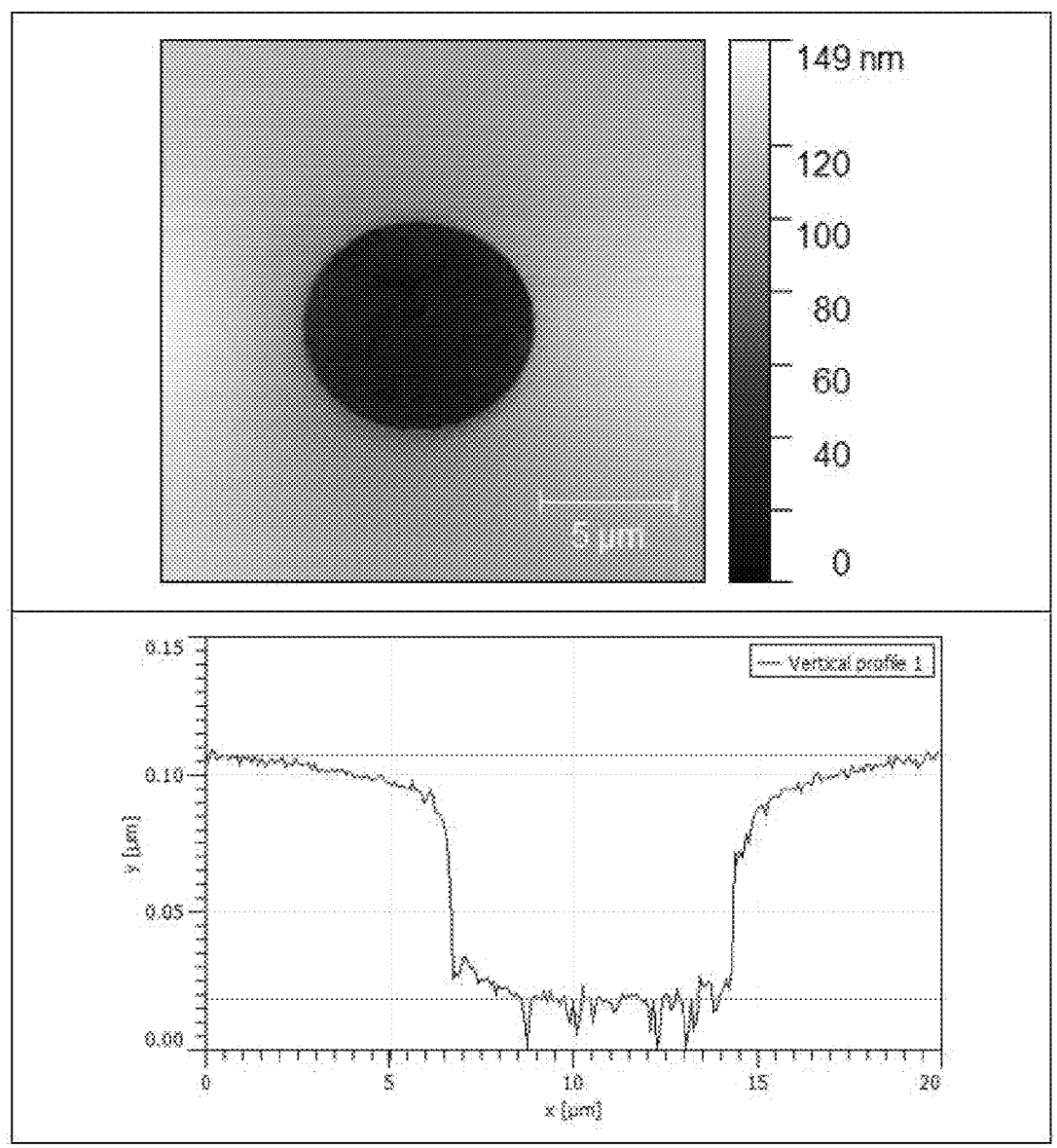

[FIG. 8]
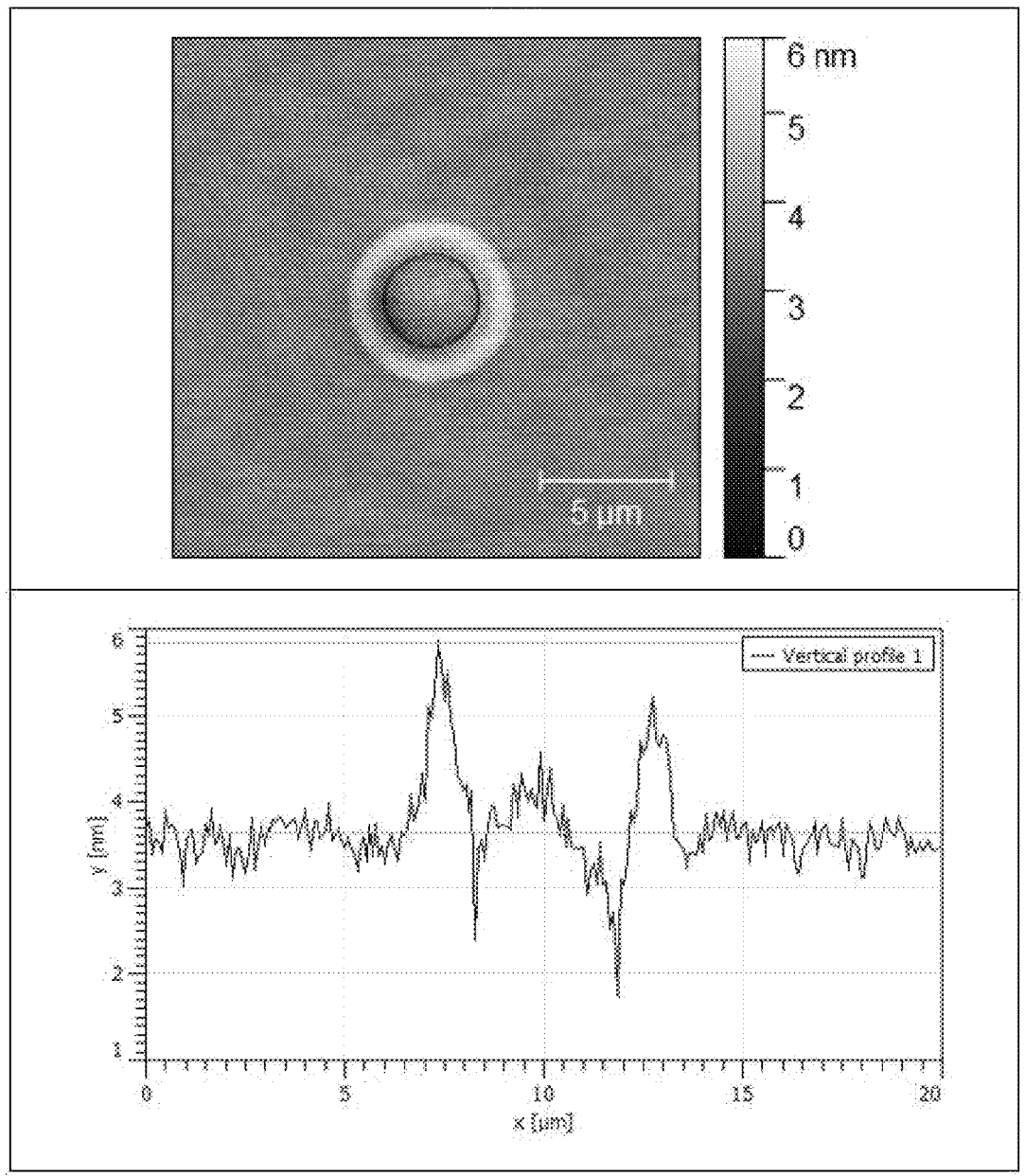

COMPOSITION FOR SEMICONDUCTOR PROCESSING AND METHOD OF FABRICATING SEMICONDUCTOR DEVICE USING THE SAME

CROSS-REFERENCE TO RELATED APPLICATION(S)

This application claims priority to Korean Patent Application No. 10-2021-0002454, filed on Jan. 8, 2021, the disclosure of which is incorporated herein by reference in its entirety.

BACKGROUND OF THE INVENTION

Field of the Invention

The present invention relates to a composition applicable to semiconductor fabrication and processing processes, and more particularly, to a composition applicable to a polishing process during semiconductor fabrication and processing.

Description of the Related Art

Chemical mechanical polishing is a technique of polishing the surface of a sample to a desired level by injecting a polishing slurry into the interface between a polishing pad and a polishing target while rubbing the surface of the polishing target with the polishing pad. As modern chemical mechanical polishing has been applied to the fabrication of large-scale semiconductor integrated circuits, it has been used as essential technology for planarization of the surfaces of the interlayer dielectric layers of devices such as transistors and multilayer wiring, and for formation of tungsten or copper wiring. As the degree of integration of semiconductor devices has increased every year and the size of a chip decreased every year, the surface structure of the semiconductor device has become more complex, and the step heights of the interlayer dielectric layers have also increased. Therefore, high-resolution lithography and atomic level planarization technology are required for a chemical mechanical polishing (CMP) process applied to a semiconductor device fabrication process. This CMP process is a process of planarizing a layer by simultaneously utilizing a physical friction force and a chemical reaction, and can produce significantly different polishing results even by minute differences in process parts and/or process solutions used in this process. Accordingly, the precision required for manufacturing and designing such process parts and/or process solutions has been improved to a higher level.

SUMMARY OF THE INVENTION

It is an object of the present invention is to provide a composition for semiconductor processing, which may exhibit excellent polishing performance by being applied to a semiconductor process involving a semiconductor wafer polishing process, more specifically, a process of polishing a semiconductor wafer including a through silicon via (TSV), may minimize defects such as dishing, erosion and protrusion, and may achieve flat polishing without a difference in flatness between a plurality of different layers when used to polish the externally exposed surfaces of the layers.

Another object of the present invention is to provide a method of fabricating a semiconductor device with minimized defect rate by applying the composition for semiconductor processing to polishing of a semiconductor wafer having a TSV formed therein so that a plurality of stacked chips connected to the TSV may function as memory chips without error or failure.

One embodiment of the present invention provides a composition for semiconductor processing containing: abrasive particles surface-modified with a silane composition; and at least one additive, and being for application to polishing of the surface of a semiconductor wafer having a through silicon via (TSV).

Another embodiment of the present invention provides a method for fabricating a semiconductor device including steps of: preparing a surface plate on which a polishing pad having a polishing surface is mounted; preparing a carrier having a polishing target accommodated therein; rotating the surface plate and the carrier in a state in which the polishing surface of the polishing pad and the polishing target surface of the polishing target are placed in contact with each other; and supplying the composition for semiconductor processing onto the polishing surface, wherein the polishing target is a semiconductor wafer having a through silicon via, and the composition for semiconductor processing contains abrasive particles and at least one additive.

The composition for semiconductor processing according to one embodiment of the present invention may exhibit excellent polishing performance by being applied to a semiconductor process involving a semiconductor wafer polishing process, more specifically, a process of polishing a semiconductor wafer including a through silicon via (TSV), may minimize defects such as dishing, erosion and protrusion, and may achieve flat polishing without a difference in flatness between a plurality of different layers when used to polish the externally exposed surfaces of the layers.

In addition, when a method of fabricating a semiconductor device using the composition for semiconductor processing is applied, it is possible to fabricate a semiconductor device with minimized defect rate so that a plurality of stacked chips connected to a structure such as the TSV may function as memory chips without error or failure.

BRIEF DESCRIPTION OF THE DRAWINGS

FIG. 1 schematically shows the cross-section in the thickness direction of a semiconductor wafer having a through silicon via before polishing using the composition for semiconductor processing according to one embodiment of the present invention.

FIG. 2 schematically shows the cross-section in the thickness direction of a semiconductor wafer having a through silicon via after polishing using the composition for semiconductor processing according to one embodiment of the present invention.

FIG. 3 schematically shows a plan view of portion A of the semiconductor wafer shown in FIG. 1.

FIG. 4 schematically illustrates a configuration related to the method for fabricating a semiconductor device according to one embodiment of the present invention.

FIG. 5 show photographs and cross-sectional profile graphs of polishing target surfaces polished using compositions for semiconductor processing according to Example 1.

FIG. 6 show photographs and cross-sectional profile graphs of polishing target surfaces polished using compositions for semiconductor processing according to Example 6.

FIG. 7 show photographs and cross-sectional profile graphs of polishing target surfaces polished using compositions for semiconductor processing according to Comparative Example 2.

FIG. 8 show photographs and cross-sectional profile graphs of polishing target surfaces polished using compositions for semiconductor processing according to Comparative Example 4.

DESCRIPTION OF SPECIFIC EMBODIMENTS

The advantages and features of the present invention, and the way of attaining them, will become apparent with reference to the embodiments described below. However, the present invention is not limited to the embodiments disclosed below and may be embodied in a variety of different forms. Rather, these embodiments are provided so that this disclosure will be thorough and complete, and will fully convey the scope of the present invention to those skilled in the art. The scope of the present invention should be defined only by the appended claims.

As used herein, the term "including", "containing", or "comprising" means that other components may be further included, unless otherwise specified.

In the drawings, the thicknesses of various layers and regions are exaggerated for clarity. In addition, in the drawings, the thicknesses of some layers and regions are exaggerated for convenience of illustration. Throughout the specification, like reference numerals refer to like components.

In addition, in the present specification, when a part, such as a layer, film, region, plate, or the like, is referred to as being "on" or "above" another part, it not only refers to a case where the part is directly above the other part, but also a case where a third part exists therebetween. Conversely, when any part is referred to as being "directly above" another part, it refers to a case where a third part does not exist therebetween. In addition, when a part, such as a layer, film, region, plate, or the like, is referred to as being "below" or "under" another part, it not only refers to a case where the part is directly below the other part, but also a case where a third part exists therebetween. Conversely, when any part is referred to as being "directly below" another part, it refers to a case where a third part does not exist therebetween.

Hereinafter, the present invention will be described in detail.

A composition for semiconductor processing according to one embodiment of the present invention may be used not only to polish a semiconductor wafer having a through silicon via as shown in FIGS. 1 to 3, but also to polish other various semiconductor wafers having or not having a through silicon via.

One embodiment of the present invention provides a composition for semiconductor processing containing abrasive particles and at least one additive, and having a value of greater than about 11.0 to less than or equal to about 110.0 as calculated according to Equation 1 below:

$$\left(\frac{R_{Cu}}{R_N}\right)^2 \times \frac{R_O}{100} \quad \text{[Equation 1]}$$

wherein $R_O$ is the removal rate (Å/min) of a silicon oxide layer during polishing using the composition for semiconductor processing, $R_N$ is the removal rate (Å/min) of a silicon nitride layer during polishing using the composition for semiconductor processing, and $R_{Cu}$ is $R_N$ is the removal rate (Å/min) of a copper layer during polishing using the composition for semiconductor processing.

Each of the removal rate of the silicon oxide layer, the removal rate of the silicon nitride layer, and the removal rate of the copper layer is a value obtained by performing polishing on a wafer having each of the layers for 60 seconds under conditions of a carrier pressing pressure of 3.0 psi, a carrier rotation speed of 120 rpm and a surface plate rotation speed of 117 rpm while supplying the composition for semiconductor processing at a flow rate of 300 mL/min.

As the composition for semiconductor processing satisfies the specified range of the value calculated according to Equation 1, which shows the correlation between the removal rates of the copper layer, the silicon oxide layer and the silicon nitride layer, it may be applied to a semiconductor process of polishing a polishing target surface including all the layers at a certain area ratio, thereby exhibiting excellent polishing performance. As the degree of integration of semiconductor devices has increased, packaging technology has been developed in which a fine via is formed in chips, then an electrode is provided therein and the upper chip and the lower chip are connected by the electrode, unlike a conventional method of connecting chips using wires. This may be referred to as a through silicon via (TSV). The TSV is technology of achieving large capacity by stacking memory chips, and may significantly improve speed and reduce power consumption compared to conventional wire bonding technology of connecting chips using wires. However, since semiconductor memory chips to which the TSV is applied are fabricated through a process of precisely processing a fine structure, formation of the TSV should not result in surface defects in order to achieve an error-free function. Thus, the performance of chemical mechanical polishing required for processing of a semiconductor substrate having the TSV formed therein may be considered a very important factor in realizing the function of the final semiconductor device.

Since the value calculated according to Equation 1 satisfies the above range, the composition for semiconductor processing may be applied to chemical mechanical polishing of a semiconductor wafer having a complex structure such as the TSV, thus exhibiting an excellent effect in terms of polishing flatness. The value calculated according to Equation 1 for the composition for semiconductor processing may function as a significantly improved technical means in terms of predicting polishing performance compared to the conventional polishing selectivity expressed as the one-dimensional ratio of the removal rates of the silicon oxide layer, the copper layer and the silicon nitride layer. That is, it could be confirmed that there were cases in which the actual polishing performance for a semiconductor wafer having the TSV formed therein was not achieved at a desired level even if the one-dimensional polishing selectivity between the layers was satisfied within a certain range, whereas the composition for semiconductor processing, which satisfies the value calculated according to Equation 1 within the specified range, showed a correlation that makes it possible to achieve a desired level of polishing performance for the semiconductor wafer having the TSV formed therein without substantial error.

Specifically, the value calculated according to Equation 1 for the composition for semiconductor processing may be greater than about 11.0 to less than or equal to about 110.0, for example, about 12.0 to about 110.0, for example, about 20.0 to about 100.0, for example, about 20.0 to about 80.0, for example, about 30.0 to about 70.0, for example, about 30.0 to about 65.0, for example, about 30.0 to about 60.0. If the value calculated according to Equation 1 is excessively small or excessively great, either side of the boundary of the discontinuous structure (such as TSV) on the polishing target surface may be over-polished, resulting in defects such as excessive dishing or excessive protrusion. That is, when the value calculated according to Equation 1 satisfies the above range, the polishing performance of the composition for semiconductor processing having this value may have the advantage of making it possible to achieve flat polishing even in the presence of a structure such as TSV without defects such as excessive dishing or excessive protrusion.

A value calculated according to Equation 3 below for the composition for semiconductor processing may be greater than about 1.00 to less than or equal to about 7.00, for example, greater than about 1.00 to less than or equal to about 6.50, for example, greater than about 1.00 to less than or equal to 2.80, for example, greater than about 1.00 to less than or equal to about 2.00, for example, greater than about 1.00 to less than or equal to about 1.50:

$$\frac{R_O}{R_{Cu}}$$ [Equation 3]

wherein $R_O$ and $R_{Cu}$ are as defined in Equation 1 above.

When the value calculated according to Equation 3 satisfies the above range while the value calculated according to Equation 1 satisfies the above-described range, the polishing performance of the composition for semiconductor processing may have the advantage of making it possible to achieve flat polishing, particularly without a protrusion, in polishing of a portion including a discontinuous structure such as TSV.

The ratio of $R_N$ to $R_{Cu}$ ($R_N/R_{Cu}$) for the composition for semiconductor processing may be greater than about 0.50 to less than or equal to about 2.00, for example, about greater than 0.50 to less than or equal to about 1.80, for example, greater than about 0.50 to less than or equal to about 1.50, for example, greater than about 0.50 to less than about 1.20. When the $R_N/R_{Cu}$ value satisfies this range while the value calculated according to Equation 1 satisfies the above-described range, the polishing performance of the composition for semiconductor processing may have the advantage of making it possible to achieve flat polishing, particularly without a protrusion, in polishing of a portion including a discontinuous structure such as TSV.

A value calculated according to Equation 2 below for the composition for semiconductor processing may be greater than about 0.50 to less than or equal to about 7.00, for example, greater than about 1.00 to less than or equal to about 7.00, for example, greater than about 1.00 to less than 2.00, for example, greater than about 1.00 to less than or equal to about 1.90, for example, greater than about 1.00 to less than or equal to about 1.70:

$$\frac{R_O}{R_N}$$ [Equation 2]

wherein $R_O$ and $R_N$ are as defined in Equation 1 above.

When the value calculated according to Equation 2 satisfies this range while the value calculated according to Equation 1 satisfies the above-described range, the polishing performance of the composition for semiconductor processing may have the advantage of making it possible to achieve flat polishing, particularly without a protrusion, in polishing of a portion including a discontinuous structure such as TSV.

In the composition for semiconductor processing, Ro may be about 500 Å/min to about 5,000 Å/min, for example, about 800 Å/min to about 5,000 Å/min, for example, about 1,000 Å/min to about 5,000 Å/min, for example, about 1,500 Å/min to about 5,000 Å/min, for example, about 2,000 Å/min to about 5,000 Å/min, for example, about 2,500 Å/min to about 5,000 Å/min, for example, about 2,500 Å/min to about 3,500 Å/min, for example, about 2,800 Å/min to about 3,500 Å/min, for example, about 3,000 Å/min to about 3,500 Å/min. When the Ro value satisfies this range while the value of Equation 1 for the composition for semiconductor processing satisfies the above-described range, the composition may be more favorable for achieving polishing performance without dishing or protrusion in polishing of a layer portion including a local discontinuous structure such as TSV.

In the composition for semiconductor processing, RN may be about 400 Å/min to about 3,000 Å/min, for example, about 450 Å/min to about 3,000 Å/min, for example, about 450 Å/min to about 2,800 Å/min, for example, about 1,500 Å/min to about 3,000 Å/min, for example, about 1,600 Å/min to about 3,000 Å/min, for example, about 1,800 Å/min to about 3,000 Å/min, for example, about 1,900 Å/min to about 3,000 Å/min, for example, about 2,000 Å/min to about 3,000 Å/min, for example, about 2,000 Å/min to about 2,800 Å/min. When the RN value satisfies this range while the value of Equation 1 for the composition for semiconductor processing satisfies the above-described range, the composition for semiconductor processing may be more favorable for achieving polishing performance without dishing or protrusion in polishing of a layer portion including a local discontinuous structure such as TSV.

In the composition for semiconductor processing, $R_{Cu}$ may be 400 Å/min to about 3,500 Å/min, for example, about 450 Å/min to about 3,500 Å/min, for example, about 450 Å/min to about 2,800 Å/min, for example, about 450 Å/min to about 2,750 Å/min, for example, about 450 Å/min to about 2,700 Å/min, for example, about 1,000 Å/min to about 3,500 Å/min, for example, about 1,000 Å/min to about 3,200 Å/min, for example, about 1,300 Å/min to about 3,200 Å/min, for example, about 1,500 Å/min to about 3,000 Å/min, for example, about 1,500 Å/min to about 2,800 Å/min, for example, about 1,500 Å/min to about 2,750 Å/min, for example, about 1,500 Å/min to about 2,700 Å/min. When the $R_{Cu}$ value satisfies this range while the value of Equation 1 for the composition for semiconductor processing satisfies the above-described range, the composition may be more favorable for achieving polishing performance without dishing or protrusion in polishing of a layer portion including a local discontinuous structure such as TSV.

The composition for semiconductor processing may be applied to polishing of the surface of a semiconductor wafer having a through silicon via (TSV). FIG. 1 schematically shows the cross-section in the thickness direction of a semiconductor wafer having a through silicon via before polishing using the composition for semiconductor processing according to one embodiment of the present invention. FIG. 2 schematically shows the cross-section in the thickness direction of a semiconductor wafer having a through silicon via after polishing using the composition for semiconductor processing according to one embodiment of the present invention. FIG. 3 schematically shows a plan view of portion A of the semiconductor wafer shown in FIG. 1. As shown in FIGS. 1 to 3, a semiconductor wafer 1 may include a substrate 50, and a silicon nitride layer 20 and silicon oxide layer 40 formed on the substrate 50. The silicon nitride layer 20 may be formed to cover at least a portion of the substrate 50. More specifically, the silicon nitride layer 20 may be formed to cover a portion of the substrate 50. The silicon nitride layer 20 may include a first silicon nitride layer 21 disposed between the substrate 50 and the silicon oxide layer 40, and a second silicon nitride layer 22 disposed inside a via 11 to be described later. The first silicon nitride layer 21 and the second silicon nitride layer 22 may be continuously or discontinuously formed. In another embodiment, the first silicon nitride layer 21 and the second silicon nitride layer 22 may be formed integrally or separately. As an example, when the first silicon nitride layer 21 and the second silicon nitride layer 22 are continuously formed or integrally formed, the second silicon nitride layer 22 may have a structure bent and extending from the first silicon nitride layer 21. In still another embodiment, when the first silicon nitride layer 21 and the second silicon nitride layer 22 are continuously formed or integrally formed, the second silicon nitride layer 22 may have a structure branched from is the first silicon nitride layer 21.

The first silicon nitride layer 21 may be formed to cover at least a portion of the surface of the substrate 50. In one embodiment, when the first silicon nitride layer 21 is formed to cover a partial area of the surface of the substrate 50, the first silicon nitride layer 21 and other layers such as the silicon oxide layer 40 may be simultaneously present at the same level on the surface of the substrate 50. In still another embodiment, when the first silicon nitride layer 21 is formed to cover the entire area of the surface of the substrate 50, the silicon oxide layer 40 may be disposed on the first silicon nitride layer 21. In another embodiment, although not specifically shown in the drawings, when the first silicon nitride layer 21 is formed to cover at least a portion of the surface of the substrate 50, an additional silicon oxide layer, which is not the silicon oxide layer 40, may also be disposed between the first silicon nitride oxide 21 and the substrate 50.

Referring to FIG. 2, in the semiconductor wafer 1, a main region which is polished using the composition for semiconductor processing may be a region in which the silicon oxide layer 40 and the through silicon via 10 are simultaneously polished. As the composition for semiconductor processing satisfies the value of Equation 1 within the above-described range, it may be more favorable for achieving flat polishing without excessive dishing and/or protrusion in polishing of a region in which the silicon oxide layer 40, the conductive filling electrode 30 and the second silicon nitride layer 22 are simultaneously present as shown in FIG. 1.

Referring to FIGS. 1 and 2, the region that is polished using the composition for semiconductor processing may include a region in which the first silicon nitride layer 21 and the through silicon via 10 are simultaneously polished. As the composition for semiconductor process satisfies the value of Equation 1 within the above-described range, it may exhibit the effect of achieving flat polishing without excessive dishing and/or protrusion in a process of polishing a region in which the silicon oxide layer 40, the conductive filling electrode 30 and the second silicon nitride layer 22 are simultaneously present as shown in FIG. 1, and in a subsequent process of polishing a region in which the first silicon nitride layer 21 and the through silicon via 10 are simultaneously polished.

As an example, the substrate 50 may include silicon (Si). However, the material of the substrate 50 is not limited thereto.

The semiconductor wafer 1 may further include a through silicon via 10. The through silicon via 10 may be formed through the semiconductor wafer 1. Specifically, the through silicon via 10 may be formed through the substrate 50, the silicon oxide layer 40 and the first silicon nitride layer 21. In another embodiment, the through-silicon electrode 10 may be formed by disposing the conductive filling electrode 30 and the second silicon nitride layer 22 in a via 11 formed to pass the semiconductor wafer 1. The second silicon nitride layer 22 may be disposed outside the conductive filling electrode 30 so as to surround the conductive filling electrode 30. The via 11 may be formed to pass through the substrate 50, the first silicon nitride layer 21 and the silicon oxide layer 40, and the through silicon via 10 may be formed by disposing the conductive filling electrode 30 and the second silicon nitride layer 22 in the via 11. It can be understood that the through-silicon via 10 includes not only a structure in which there is substantially no gap between the via 11, the conductive filling electrode 30 and the second silicon nitride layer 22, but also a structure in which there is a minute gap that is unavoidable in the process.

The conductive filling electrode 30 includes a component having conductivity, which may include, but particularly not limited to, for example, one selected from the group consisting of copper (Cu), silver (Ag), gold (Au), nickel (Ni), and combinations thereof. In one embodiment, the conductive filling electrode 30 may include copper (Cu). For example, the conductive filling electrode 30 may be composed of copper (Cu).

The silicon oxide layer 40 may function as a dielectric layer. The silicon oxide layer 40 may include the first silicon nitride layer 21 formed on the surface thereof so as to cover at least a portion of the surface thereof.

The first silicon nitride layer 21 may be formed to cover the entire surface of the silicon oxide layer 40, or may also be formed to cover a portion of the surface of the silicon oxide layer 40. The silicon nitride layer 20 may function as a dielectric layer or a barrier layer. Specifically, the first silicon nitride layer 21 may function as a dielectric layer, and the second silicon nitride layer 22 may function as both a dielectric layer and a barrier layer. The second silicon nitride layer 22 may be disposed inside the via 11 together with the conductive filling electrode 30 so as to surround the conductive filling electrode 30. The second silicon nitride layer 22 may perform a barrier function by preventing copper atoms contained in the conductive filling electrode 30 from diffusing to the substrate 50.

As the surface of the semiconductor wafer 1 having this TSV structure is applied as a polishing target surface, the technical advantage of polishing performance of the composition for semiconductor processing, which is used to polish the polishing target surface, may be maximized by satisfying the value of Equation 1 within the above-described range.

Referring to FIG. 3, the ratio (D2/D1) of the diameter (D2) of the conductive filling electrode 30 to the total diameter (D1) of the via 11 may be about 0.5 to about 1.2, for example, about 0.7 to about 1.2, for example, about 0.7 to about 1.0. As the surface of the semiconductor wafer 1 having this TSV structure is applied as a polishing target surface, the technical advantage of polishing performance of the composition for semiconductor processing, which is used to polish the polishing target surface, may be maximized by satisfying the value of Equation 1 within the above-described range.

In one embodiment, the semiconductor wafer 1 includes the via 11 and the second silicon nitride layer 22 disposed inside the via 11, and the ratio (2T1/D1) of the thickness (T1) of the second silicon nitride layer 22 to the total radius (D1/2) of the via 11 may be about 0.1 to about 0.5, for example, about 0.1 to about 0.3. As the surface of the semiconductor wafer 1 having this TSV structure is applied as a polishing target surface, the technical advantage of polishing performance of the composition for semiconductor processing, which is used to polish the polishing target surface, may be maximized by satisfying the value of Equation 1 within the above-described range.

The composition for semiconductor processing may contain abrasive particles and at least one additive. The abrasive particles are a component that mainly performs physical etching, and may perform planarization through mechanical friction with the polishing target surface of a polishing target.

In one embodiment, the abrasive particles may include inorganic particles, organic particles, or organic-inorganic composite particles. As used herein, the term "inorganic particles" or "organic particles" refers to a particle shaped material containing an inorganic component or an organic component as a main component, and should be understood to also encompass the case in which a trace amount of a different component is contained, that is, the case in which the inorganic particles contain a trace amount of an organic component, and the organic particles contain a trace amount of an inorganic component. In this case, the term "trace amount" refers to an amount of about 0.005 wt % to about 0.03 wt % based on 100 wt % of the total weight of the abrasive particles. As used herein, the term "organic-inorganic composite particles" refers to particles containing an organic component and an inorganic component, provided that the content of any one of the two components is 50 wt % to 90 wt %.

In one embodiment, the abrasive particles may include inorganic particles. The inorganic particles may include, for example, one selected from the group consisting of silica ($SiO_2$), ceria ($CeO_2$), alumina ($Al_2O_3$), zirconia ($ZrO_2$), and combinations thereof. As the abrasive particles include inorganic particles, the chemical compatibility of the abrasive particles with the at least one additive in the application of the composition for semiconductor processing may be controlled within a predicted range, thereby minimizing side effects caused by a sudden change in polishing performance.

The abrasive particles may be in a colloidal state. For example, the abrasive particles may include colloidal inorganic particles.

The hydrogen ion concentration (pH) of the composition for semiconductor processing may be about 2 to about 5, for example, about 3 to about 5, for example, about 3 to less than about 5, for example, about 4.

The zeta potential value of the abrasive particles in the composition for semiconductor processing may be a positive (+) value. Specifically, the abrasive particles in the composition for semiconductor processing may contain inorganic particles and exhibit a positive (+) zeta potential value. The zeta potential value of the abrasive particles in the composition for semiconductor processing may be about +5 mV to about +50 mV, for example, about +10 mV to about +40 mV, for example, about +10 mV to about +30 mV. The method of measuring the zeta potential of the abrasive particles in the composition for semiconductor processing is not particularly limited, but for example, the zeta potential may be measured using a zeta potential measuring device (Zetasizer Nano ZS, Malvern) after introducing about 1 mL of the composition for semiconductor processing into a measurement cell. For example, the zeta potential value may be an average value of about 100 measurements.

When the zeta potential value of the abrasive particles in the composition for semiconductor processing satisfies the above range while the hydrogen ion concentration (pH) of the composition for semiconductor processing satisfies the above-described range, the polishing characteristics of the composition for semiconductor processing for a semiconductor wafer may be optimally designed. Specifically, the abrasive particles should be adsorbed onto the polishing target surface of the semiconductor wafer at a predetermined level or higher, and at the same time, should be easily separated from the polishing target surface at a predetermined level or higher. If the abrasive particles are adsorbed onto the polishing target surface of the semiconductor wafer by excessive adsorption force and are not easily separated therefrom, they may cause defects such as scratches on the polishing target surface, and on the contrary, if the abrasive particles are not adsorbed to the polishing target surface by a predetermined attractive force and have excessive fluidity, the physical frictional force may be lowered and the removal rate of the polishing target surface may not reach a desired level. Considering these points, when the zeta potential value of the abrasive particles in the composition for semiconductor processing satisfies the above-described range while the hydrogen ion concentration (pH) of the composition for semiconductor processing satisfies the above-described range, the abrasive particles may be adsorbed onto the polishing target surface of the semiconductor wafer at an appropriate level and at the same time, may be easily separated from the polishing target surface, suggesting that ensuring a desired level of polishing rate while maximizing the defect prevention effect may be more favorably achieved. These technical effects may be expressed as a significant polishing result when the surface to which the composition for semiconductor processing is applied includes a silicon nitride layer and a copper layer, and in particular, these effects may be further maximized in polishing of the surface including a silicon oxide layer.

In one embodiment, the abrasive particles may include particles that have been surface-treated so that the zeta potential value of the abrasive particles in the composition for semiconductor processing is a positive (+) value. Specifically, the abrasive particles may include inorganic particles, and the inorganic particles may include particles surface-treated with at least one organic component. The at least one organic component applied to the surface treatment of the inorganic particles may be used in an amount of about 0.005 wt % to 1 wt %, for example, about 0.005 wt % to about 0.03 wt %, based on 100 wt % of the total weight of the abrasive particles.

In one embodiment, the at least one organic component used for surface treatment of the inorganic particles may include, for example, one selected from the group consisting of amino silane, alkoxy silane, ethoxy silane, epoxy silane, and combinations thereof.

In one embodiment, the inorganic particles may include silica ($SiO_2$), and the at least one organic component applied to the surface treatment of the inorganic particles may include amino silane or epoxy silane. In this case, the abrasive particles may have a surface charge favorable for satisfying the value of Equation 1 for the composition for semiconductor processing within the specified range. As a result, these abrasive particles may be more advantageous in terms of preventing excessive dishing of the through silicon via in polishing of the surface of the semiconductor wafer. More specifically, the abrasive particles may be more advantageous in terms of preventing excessive dishing of the conductive filling electrode in polishing of the surface of the semiconductor wafer.

For example, the at least one organic component applied to the surface treatment may include an amino silane and an epoxy silane, wherein the molar ratio of the amino silane to the epoxy silane may be about 10:1 to about 5:1, for example, about 10:1 to about 6:1, for example, about 10:1 to about 7:1, for example, about 10:1 to about 8:1, for example, about 9.5:1 to about 8.5:1, for example, about 9:1.

In another embodiment, the abrasive particles may include organic-inorganic composite particles. The organic-inorganic composite particles may be, for example, particles having a core-shell structure consisting of: a core including a polymer resin; and a shell including an inorganic component disposed on the surface of the core.

The core of the organic-inorganic composite particle may include, as the polymer resin, for example, polymethylmethacrylate (PMMA) resin, polystyrene (PS) resin, or the like. The inorganic component of the shell may include, for example, silica ($SiO_2$), ceria ($CeO_2$), alumina ($Al_2O_3$), titania ($TiO_2$), zirconia ($ZrO_2$), germania ($GeO_2$), or the like.

The particles included in the abrasive particles may have, for example, an average particle diameter (D50) of about 5 nm to about 150 nm, for example, about 5 nm to about 100 nm, for example, about 5 nm to about 80 nm, for example, about 10 nm to about 80 nm, for example, about 30 nm to about 50 nm, for example, about 30 nm to about 45 nm, for example, about 34 nm to about 44 nm. As the abrasive particles having such a size are applied, the composition for semiconductor processing may be more favorable for satisfying the condition of Equation 1.

For example, the abrasive particles may have a 10% cumulative mass particle size distribution diameter (D10) of about 5 nm to about 50 nm, for example, about 5 nm to about 35 nm, for example, about 10 nm to about 35 nm, for example, about 20 nm to about 35 nm, for example, about 23 nm to about 33 nm, in the particle size distribution thereof.

For example, the abrasive particles may have a 90% cumulative mass particle size distribution diameter (D90) of about 40 nm to about 150 nm, for example, about 40 nm to about 100 nm, for example, about 45 nm to about 80 nm, for example, about 45 nm to about 65 nm, for example, 50 nm to about 60 nm, in the particle size distribution thereof.

For example, the abrasive particles may have a 10% cumulative mass particle size distribution diameter (D10) of about 23 nm to about 33 nm, a 50% cumulative mass particle size distribution diameter (D50) of about 34 nm to about 44 nm, and a 90% cumulative mass particle size distribution diameter (D90) of about 50 nm to about 60 nm, in the particle size distribution thereof.

The abrasive particles may satisfy a condition of $1.10 \leq D90/D50 \leq 1.80$, for example, $1.50 \leq D90/D10 \leq 2.70$, for example, $1.00 \leq D50/D10 \leq 2.00$, in the particle size distribution thereof. When the abrasive particles having such a particle size distribution are applied, the composition for semiconductor processing may be more favorable for satisfying the value of Equation 1 within the specified range, and the composition may be more favorable for producing an excellent polishing result corresponding thereto.

A method of measuring the particle size distribution of the abrasive particles is not particularly limited, and the particle size distribution may be measured using any general-purpose device used for particle size analysis of nanometer (nm) sized particle powder in the art.

The composition for semiconductor processing may contain at least one additive. The at least one additive may serve mainly to adjust the surface state of the polishing target to be suitable for polishing through a chemical reaction.

The at least one additive may include, for example, an organic acid. The organic acid may function as a complexing agent that mainly controls polishing properties for copper or traps metal ions such as copper ions. For example, the organic acid may include one selected from the group consisting of acetic acid, formic acid, benzoic acid, nicotinic acid, picolinic acid, alanine, phenylalanine, valine, leucine, isoleucine, arginine, aspartic acid, citric acid, adipic acid, succinic acid, oxalic acid, glycine, glutamic acid, glutaric acid, phthalic acid, histidine, threonine, serine, cysteine, methionine, asparagine, tyrosine, diiodotyrosine, tryptophan, proline, oxyproline, ethylenediaminetetraacetic acid (EDTA), nitrotriacetic acid (NTA), iminodiacetic acid (IDA), and combinations thereof. In one embodiment, the organic acid may include glycine or ethylenediaminetetraacetic acid (EDTA).

The at least one additive may include the organic acid, and the amount of the organic acid may be about 0.5 parts by weight to about 6 parts by weight, for example, about 1 part by weight to about 6 parts by weight, for example, about 1 part by weight to about 5 parts by weight, for example, more than about 1 part by weight to less than or equal to about 5 parts by weight, based on 100 parts by weight of the abrasive particles. When the content of the organic acid relative to the abrasive particles is within the above range, the composition for semiconductor processing may be more favorable for exhibiting excellent performance for planarization of the boundary between a copper layer and a layer composed of a different component in a surface including these layers. For example, the composition for semiconductor processing may be more favorable for achieving excellent flatness without excessive dishing or excessive protrusion for the polishing target surface including the copper layer as a structure such as the conductive filling electrode 30 of the through silicon via 10.

The at least one additive may include, for example, an azole-based compound. The azole-based compound may serve mainly to control the surface properties of the copper layer. For example, the azole-based compound may include one selected from the group consisting of benzotriazole (BTA), 5-methyl-1H-benzotriazole (5-MBTA), 3-amino-1,2,4-triazole, 5-phenyl-1H-tetrazole, 3-amino-5-methyl-4H-1,2,4-triazole, 5-aminotetrazole (ATZ), 1,2,4-triazole, tolitriazole, and combinations thereof. In one embodiment, the azole-based compound may include one selected from the group consisting of 5-aminotetrazole (ATZ), 5-methyl-1H-benzotriazole (5-MBTA), and combinations thereof.

In one embodiment, the at least one additive may include an organic acid and an azole-based compound, and the weight ratio of the organic acid to the azole-based compound may be about 3:1 to less than about 10:1, for example, about 3:1 to about 9.5:1, for example, about 3:1 to about 8:1, for example, about 4:1 to about 8:1, for example, about 4.5:1 to about 7.5:1, for example, about 5:1 to about 7.5:1. When the composition for semiconductor processing includes the organic acid and the azole-based compound and the weight ratio of the organic acid to the azole-based compound satisfies the above-described range, the composition for semiconductor processing may produce high-level polishing results when applied to a process of polishing a surface including a copper layer. For example, the composition for semiconductor processing may be more favorable for achieving excellent flatness for the polishing target surface including the copper layer as a structure such as the conductive filling electrode 30 of the through silicon via 10. As an example, when the composition for semiconductor processing contains the azole-based compound and glycine or ethylenediaminetetraacetic acid (EDTA) as an example of the organic acid, and when the weight ratio between the organic acid and the azole compound satisfies the above-described range, the composition for semiconductor processing may realize the removal rate of the copper layer at a certain level or higher while preventing excessive corrosion of the copper layer, thereby exhibiting an excellent planarization effect on the polishing target surface of the semiconductor wafer 1 having the through silicon via 10.

The at least one additive may include a phosphoric acid-based compound. The phosphoric acid-based compound may serve to control the polishing properties of the silicon nitride layer 20. For example, the phosphoric acid-based compound may include one selected from the group consisting of phosphomolybdic acid, nitrilotris(methylenephosphonic acid), phosphorus trichloride, and combinations thereof. In one embodiment, the phosphoric acid-based compound may include nitrillotris(methylenephosphonic acid).

In one embodiment, the composition for semiconductor processing may contain the phosphoric acid-based compound in an amount of about 0.01 parts by weight to about 1.0 parts by weight, about 0.01 parts by weight to about 0.1 parts by weight, for example, about 0.01 parts by weight to about 0.5 parts by weight, for example, about 0.01 parts by weight to about 0.1 parts by weight, for example, about 0.01 parts by weight to about 0.05 parts by weight, for example, about 0.01 parts by weight to about 0.03 parts by weight, based on 100 parts by weight of the abrasive particles. When the content of the phosphoric acid-based compound relative to the content of the abrasive particles satisfies the above range, a balance between the physical polishing properties and chemical polishing properties of the composition for the silicon nitride layer 20 may be properly ensured. For example, the composition for semiconductor processing may be more favorable for achieving excellent flatness for the polishing target surface including an inner layer structure such as the second silicon nitride layer 22 included in the through silicon via 10 as described above.

In one embodiment, the composition for semiconductor processing may contain, as the at least one additive, the organic acid, the azole-based compound, and the phosphoric acid-based compound, and the total weight of the phosphoric acid-based compound may be about 0.30 parts by weight to about 2.00 parts by weight, for example, about 0.35 parts by weight to about 2.00 parts by weight, for example, about 0.37 parts by weight to about 2.00 parts by weight, for example, about 0.40 parts by weight to about 2.00 parts by weight, for example, about 0.40 parts by weight to about 1.50 parts by weight, for example, about 0.50 parts by weight to about 1.50 parts by weight, for example, about 0.50 parts by weight to about 1.20 parts by weight, based on 100 parts by weight of the total weight of the organic acid and the azole-based compound. When this condition is satisfied, the composition for semiconductor processing may achieve excellent flatness and surface properties in polishing of the surface including both the copper layer and the silicon nitride layer.

The at least one additive may include a compound of the following Formula 1:

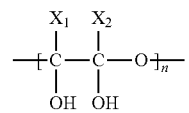

[Formula 1]

wherein, n is an integer ranging from 1 to 10, and $X_1$ and $X_2$ are the same as or different from each other and are each independently selected from the group consisting of hydrogen, a halogen group, a substituted or unsubstituted alkyl group having 1 to 10 carbon atoms, a substituted or unsubstituted cycloalkyl group having 3 to 10 carbon atoms, a substituted or unsubstituted alkenyl group having 2 to 10 carbon atoms, and a substituted or unsubstituted alkynyl group having 2 to 10 carbon atoms, provided that any one or more of $X_1$ and $X_2$ are a halogen group.

In one embodiment, the halogen group may include a fluorine (—F) group. That is, the compound of Formula 1 may be a fluorine-based compound.

In one embodiment, n may be an integer ranging from 3 to 8.

When the compound of Formula 1 is included, it is possible to effectively prevent excessive adsorption of the abrasive particles to the polishing target surface before application of the composition for semiconductor processing to a polishing process, and/or during application of the composition to the polishing process, and it is possible to maintain the surface state of the silicon oxide layer in a state favorable for polishing. In addition, as the compound of Formula 1 includes a halogen group, it is possible to obtain the advantage of improving the long-term storage stability of the composition for semiconductor processing by preventing the growth of bacteria and fungi in the composition for semiconductor processing.

The at least one additive may further include, in addition to the compound of Formula I, one selected from the group consisting of polyethylene glycol, polypropylene glycol, a polyethylene-propylene copolymer, polyalkyl oxide, polyoxyethylene oxide (PEO), polyethylene oxide, polypropylene oxide, a sodium sulfonate fluorine-based compound, a phosphoric acid ester fluorine-based compound, an amine oxide fluorine-based compound, a betaine fluorine-based compound, an ammonium fluorine-based compound, a stearic acid ester fluorine-based compound, and a quaternary ammonium fluorine-based compound, an ethylene oxide/propylene oxide fluorine-based compound, a polyoxyethylene fluorine-based compound, and combinations thereof.

When the at least one additive includes the compound of Formula 1, the content of the compound of Formula 1 may be about 0.01 parts by weight to about 0.20 parts by weight, for example, about 0.01 parts by weight to about 0.15 parts by weight, for example, about 0.01 parts by weight to about 0.10 parts by weight, for example, about 0.01 parts by weight to about 0.05 parts by weight, based on 100 parts by weight of the abrasive particles. When the content of the compound of Formula 1 with respect to the abrasive particles is within this range, the compound of Formula 1 may be more advantageous in terms of the effect of preventing excessive adsorption of the abrasive particles, and as a result, it may be more favorable for obtaining the effect of preventing the occurrence of surface defects on the polishing target surface. In addition, it may be more advantageous in terms of preventing the occurrence of protrusion.

The at least one additive may further include a pH adjusting agent. The pH adjusting agent may include, for example, one selected from the group consisting of hydrochloric acid (HCl), phosphoric acid ($H_3PO_4$), sulfuric acid ($H_2SO_4$), nitric acid ($HNO_3$), ammonium hydroxide ($NH_4OH$), potassium hydroxide (KOH), sodium hydroxide (NaOH), and combinations thereof. When the at least one additive includes the pH adjusting agent, the pH adjusting agent may be included in an amount of about 0.01 parts by weight to about 5 parts by weight based on 100 parts by weight of the abrasive particles.

The composition for semiconductor processing may contain a residual content of a solvent, in addition to the above-described components. The solvent may be, for example, water ($H_2O$), specifically ultrapure water.

The composition for semiconductor processing may have a solid content of about 5 wt % to about 20 wt %. If the solid content is excessively low, a problem may arise in that the removal rate of the silicon oxide layer is not sufficiently ensured, and if the solid content is excessively high, a problem may arise in that defects occur due to agglomeration of the abrasive particles. That is, when the solid content satisfies the above range while the composition for semiconductor processing includes the above-described components and the solvent, the composition for semiconductor processing may be more advantageously supplied at a uniform flow rate when being applied to a polishing process. In addition, the composition for semiconductor processing may be more favorable for ensuring uniform dispersibility and storage stability during distribution and storage thereof.

As described above, when the value of Equation 1 obtained from the removal of each of the silicon oxide layer, the silicon nitride layer and the copper layer satisfies the specified range, the composition for semiconductor processing may exhibit an excellent effect in terms of preventing the occurrence of protrusion and/or excessive dishing in a polishing target surface including layers composed of different materials at the same time. More specifically, as described above, when the composition for semiconductor process is applied to polishing of a polishing target surface which is the surface of the silicon oxide layer 40 including the through silicon via 10 which includes the second silicon nitride layer 22 as an inner layer and the conductive filling electrode 30 composed of copper, it may exhibit a particularly good planarization effect.

Another embodiment of the present invention provides a method for fabricating a semiconductor device including steps of: preparing a surface plate on which a polishing pad having a polishing surface is mounted; preparing a carrier having a polishing target accommodated therein; rotating the surface plate and the carrier in a state in which the polishing surface of the polishing pad and the polishing target surface of the polishing target are placed in contact with each other; and supplying the composition for semiconductor processing onto the polishing surface, wherein the polishing target is a semiconductor wafer having a through silicon via, and the composition for semiconductor processing contains abrasive particles, surface-modified with a silane composition, and at least one additive.

All details regarding the composition for semiconductor processing used in the above method are the same as those described above with respect to the composition for semiconductor processing.

FIG. 4 schematically illustrates a configuration related to the method for fabricating a semiconductor device according to one embodiment. Referring to FIG. 4, the method for fabricating a semiconductor device may include steps of: preparing a surface plate 120 on which a polishing pad 110 having a polishing surface is mounted; and preparing a carrier 160 having a polishing target 130 accommodated therein.

In the method for fabricating a semiconductor device, the polishing target 130 may be a semiconductor wafer having a through silicon via (TSV). The TSV is technology of achieving large capacity by stacking memory chips, and may significantly improve speed and reduce power consumption compared to conventional wire bonding technology of connecting chips using wires. However, since semiconductor memory chips to which the TSV is applied are fabricated through a process of precisely processing a fine structure, formation of the TSV should not result in surface defects in order to achieve an error-free function. Thus, the performance of chemical mechanical polishing required for processing of a semiconductor substrate having the TSV formed therein may be considered a very important factor in realizing the function of the final semiconductor device. Referring to FIGS. 1 to 4, the polishing object 130 may be a semiconductor wafer having a through silicon via 10, and the semiconductor wafer may include: a substrate 50; a first silicon nitride layer 21 formed on the substrate 50; a silicon oxide layer 40 formed on the first silicon nitride layer 21; and a through silicon via 10. Here, the through silicon via 10 may include: a conductive filling electrode 30; and a second silicon nitride layer 22 disposed outside the conductive filling electrode 30. Specifically, the conductive filling electrode 30 and the second silicon nitride layer 22 may be disposed in a via 11 formed through the semiconductor wafer. In the method for fabricating a semiconductor device, details regarding the substrate 50, the first silicon nitride layer 21, the silicon oxide layer 40, the through silicon via 10, the conductive filling electrode 30, and the second silicon nitride layer 22, as well as technical advantages thereof, are as described above with respect to the composition for semiconductor processing.

As the method for fabricating a semiconductor device is performed using the composition for semiconductor processing according to the present invention, it may achieve excellent flatness without protrusion and/or dishing in polishing of the polishing target surface including the copper layer, the silicon oxide layer and the silicon nitride layer at the same time by the TSV.

For example, the ratio of $R_O$ to $R_{Cu}$ ($R_O/R_{Cu}$; Equation 3) for the composition for semiconductor processing may be greater than about 1.00 to less than or equal to about 7.00, for example, greater than about 1.00 to less than or equal to 6.50, for example, greater than 1.00 to less than or equal to 2.80, for example, greater than about 1.00 to less than or equal to about 2.00, for example, greater than 1.00 to less than or equal to 1.50.

For example, the ratio of $R_N$ to $R_{Cu}$ ($R_N/R_{Cu}$) for the composition for semiconductor processing may be greater than about 0.50 to less than or equal to about 2.00, for example, greater than about 0.50 to less than or equal to about 1.80, for example, greater than about 0.50 to less than about 1.50, for example, greater than about 0.50 to less than about 1.20.

For example, the ratio of $R_O$ to $R_N$ ($R_O/R_N$; Equation 2) for the composition for semiconductor processing may be greater than about 0.50 to less than or equal to about 7.00, for example, greater than about 1.00 to less than or equal to about 7.00, for example, greater than about 1.00 to less than about 2.00, for example, greater than about 1.00 to less than or equal to about 1.90, for example, greater than about 1.00 to less than or equal to about 1.70.

For example, $R_O$ may be about 500 Å/min to about 5,000 Å/min, for example, about 800 Å/min to about 5,000 Å/min, for example, about 1,000 Å/min to about 5,000 Å/min, for example, about 1,500 Å/min to about 5,000 Å/min, for example, about 2,000 Å/min to about 5,000 Å/min, for example, about 2,500 Å/min to about 5,000 Å/min, for example, about 2,500 Å/min to about 3,500 Å/min, for example, about 2,800 Å/min to about 3,500 Å/min, for example, about 3,000 Å/min to about 3,500 Å/min.

For example, RN may be about 400 Å/min to about 3,000 Å/min, for example, about 450 Å/min to about 3,000 Å/min, for example, about 450 Å/min to about 2,800 Å/min, for example, about 1,500 Å/min to about 3,000 Å/min, for example, about 1,600 Å/min to about 3,000 Å/min, for example, about 1,800 Å/min to about 3,000Å/min, for example, about 1,900 Å/min to about 3,000 Å/min, for example, about 2,000 Å/min to about 3,000 Å/min, for example, about 2,000 Å/min to about 2,800 Å/min.

For example, $R_{Cu}$ may be about 400 Å/min to about 3,500 Å/min, for example, about 450 Å/min to about 3,500 Å/min, for example, about 450 Å/min to about 2,800 Å/min, for example, about 450 Å/min to about 2,750 Å/min, for example, about 450 Å/min to about 2,700 Å/min, for example, about 1,000 Å/min to about 3,500 Å/min, for example, about 1,000 Å/min to about 3,200 Å/min, for example, about 1,300 Å/min to about 3,200 Å/min, for example, about 1,500 Å/min to about 3,000 Å/min, for example, about 1,500 Å/min to about 2,800 Å/min, for example, about 1,500 Å/min to about 2,750 Å/min, for example, about 1,500 Å/min to about 2,700 Å/min.

In the method for fabricating a semiconductor device, details regarding the range of each of $R_O$, $R_N$ and $R_{Cu}$, the ratios therebetween and the technical advantages thereof may be the same as described above with respect to the composition for semiconductor processing.

Referring to FIG. 4, the method for fabricating a semiconductor device may include a step of rotating the surface plate 120 and the carrier 160 in a state in which the polishing surface of the polishing pad 110 and the polishing target surface of the polishing target 130 are placed in contact with each other.

The polishing pad 110 may be mounted on the surface plate 120 so that the polishing surface thereof becomes the top surface, and the polishing target 130 is accommodated in the carrier 160 so that the polishing target surface thereof becomes the bottom surface, whereby the polishing surface and the polishing target surface may be placed in contact with each other. The expression "the polishing surface and the polishing target surface are placed in contact with each other" may be understood to include not only a case in which they are in direct physical contact with each other, but also a case in which they indirectly contact each other through the abrasive particles contained in the composition for semiconductor processing.

As the surface plate 120 rotates, the polishing pad 110 also rotates along substantially the same trajectory and at substantially the same speed, and as the carrier 160 rotates, the polishing target 130 also rotates along substantially the same trajectory and at substantially the same speed. The surface plate 120 and the carrier 160 may rotate in the same direction or in different directions.

In one embodiment, the rotation speed of each of the surface plate 120 and the carrier 160 may be about 10 rpm to about 500 rpm, for example, about 30 rpm to about 200 rpm. When each of the surface plate 120 and the carrier 160 rotates at a rotation speed within the above range, the frictional behavior between the polishing surface and the polishing target surface due to the rotational centrifugal force makes it possible to obtain excellent effects in terms of ensuring polishing flatness and preventing defects such as such as protrusion and dishing on the polishing target surface, in cooperation with the composition for semiconductor processing which is supplied onto the polishing surface. More specifically, this frictional behavior may be more advantageous in terms of the result of polishing of the polishing target surface that includes the copper layer, the silicon oxide layer and the silicon nitride layer flayer at the same time by the structure of the TSV.

In one embodiment, the rotation speed of the carrier 160 may be higher than the rotation speed of the surface plate 120. As the carrier 160 is rotated at a higher speed than the surface plate 120, the polishing target surface of the polishing target 130 may be favorably polished without defects while polishing stability is ensured.

In one embodiment, in the method for fabricating a semiconductor device, the surface plate 120 and the carrier 160 may be rotated under a condition in which the carrier 160 is pressed against the polishing surface. As the carrier 160 is pressed against the polishing surface under a predetermined pressure condition, excellent polishing performance may be realized not only in a case in which the polishing target surface of the polishing target 130 is in direct contact with the polishing surface of the polishing pad 110 during polishing, but also in a case in which the polishing target surface and the polishing surface indirectly contact each other through the composition 150 for semiconductor processing during polishing. For example, the load under which the carrier 160 is pressed against the polishing surface may be about 0.01 psi to about 20 psi, for example, about 0.1 psi to about 15 psi.

Referring to FIG. 4, the method for fabricating a semiconductor device may further include a step of supplying the composition 150 for semiconductor processing onto the polishing surface. More specifically, the composition 150 for semiconductor processing may be supplied onto the polishing surface through a supply nozzle 140.

In one embodiment, the flow rate of the composition 150 for semiconductor processing that is supplied through the supply nozzle 140 may be about 10 mL/min to about 1,000 mL/min, for example, about 10 mL/min to about 800 mL/min, for example, from about 50 mL/min to about 500 mL/min. When the composition 150 for semiconductor processing, which satisfies the value of Equation 1 within the specified range, is supplied onto the polishing surface at a flow rate within the range, the frictional behavior between the polishing surface and the polishing target surface, which is mediated by the composition, may be more favorable for improving polishing performance for the polishing target surface. More specifically, the frictional behavior may be more advantageous in terms of ensuring polishing flatness and preventing defects such as protrusion and dishing in polishing of the polishing target surface that simultaneously includes the copper layer, the silicon oxide layer and the silicon nitride layer by the structure of the TSV.

The composition for semiconductor processing may contain abrasive particles and at least one additive, and details regarding the abrasive particles and the at least one additive are the same as described above with respect to the composition for semiconductor processing. That is, all specific examples of the abrasive particles and the at least one additive, described above with respect to the composition for semiconductor processing, and the technical advantages thereof, may likewise be applied to the composition for semiconductor processing that is applied to the method for fabricating a semiconductor device, and may provide advantageous interactions in terms of achieving technical objectives in relation to other configurations of the method for fabricating a semiconductor, for example, the structure and driving of each of the surface plate and the carrier.

Referring to FIG. 4, in one embodiment, the method for fabricating a semiconductor device may further include a step of processing the polishing surface of the polishing pad 110 by a conditioner 170. The polishing surface of the polishing pad 110 is chemically affected by continuous supply of the composition 150 for semiconductor processing, and at the same time, is physically affected by physical contact with the polishing target surface of the polishing target 130. If the state of the polished surface is modified due to such chemical/physical influence, it may be difficult to uniformly maintain polishing performance for the polishing target surface. The step of processing the polishing surface by the conditioner 170 may contribute to allowing the polishing surface to be constantly maintained in a state suitable for polishing.

For example, the conditioner 170 may serve to roughen the polishing surface while rotating at a predetermined speed. The rotation speed of the conditioner 170 may be, for example, about 10 rpm to about 500 rpm, for example, about 50 rpm to about 500 rpm, for example, about 100 rpm to about 500 rpm, for example, about 200 rpm to about 500 rpm, for example, greater than about 200 rpm to less than about 400 rpm.

The conditioner 170 may rotate while being pressed against the polishing surface of the polishing pad 110 under a predetermined pressure. For example, the pressure under which the conditioner 170 is pressed against the polishing surface may be about 1 psi to about 20 psi, for example, about 1 psi to about 15 psi, for example, about 5 psi to about 15 psi, for example, about 5 psi to about 10 psi.

As surface treatment of the polishing surface 170 is performed using the conditioner 170 under the above-described process conditions, the polishing surface may be maintained in an optimal surface state throughout the polishing process, and the polishing performance of the polishing surface under the conditions of application of the composition 150 for semiconductor processing composition may be effectively maintained for a long period of time.

Hereinafter, specific examples of the present invention will be presented. However, the examples described below serve merely to illustrate or explain the present disclosure in detail, and the scope of the present disclosure should not be limited thereto and should be defined by the appended claims.

EXAMPLES AND COMPARATIVE EXAMPLES

Example 1

As abrasive particles, colloidal silica particles (EXSKC-01, Nouryon) were used. The surfaces of the silica particles were modified with a silane composition including amino silane and epoxy silane at a weight ratio of 9:1. Glycine (A3-10, Yunwoo Chemical Co., Ltd.), an azole-based compound (BNO-CPA-001, BNOCHEM), a phosphoric acid-based compound (BNO-SNA-B1, BNOCHEM) and a fluorine-based compound (BNO-BS-BOH, BNOCHEM) are added to and mixed with the silica particles in the amounts (parts by weight) shown in Table 1 below based on 100 parts by weight of the silica particles. Then, an ultrapure solvent was added to the mixture to reach a solid content of 15.6 wt %, thus preparing a composition for semiconductor processing.

Examples 2 and 3

Compositions for semiconductor processing were prepared in the same manner as in Example 1, except that the content of each component was changed as shown in Table 1 below.

Example 4

A composition for semiconductor processing was prepared in the same manner as in Example 1, except that glycine (A3-10, Yunwoo Chemical Co., Ltd.) and the fluorine-based compound (BNO-BS-BOH, BNOCHEM) were excluded, ethylenediaminetetraacetic acid (EDTA) was included, and the content of each component was changed as shown in Table 1 below.

Examples 5 and 6

Compositions for semiconductor processing were prepared in the same manner as in Example 1, except that the content of each component was changed as shown in Table 1 below.

Comparative Example 1

A composition for semiconductor processing was prepared in the same manner as in Example 1, except that non-surface-modified silica particles were used and the content of each component was changed as shown in Table 1 below.

Comparative Examples 2 to 4

Compositions for semiconductor processing were prepared in the same manner as in Example 1, except that the content of each component was changed as shown in Table 1 below.

<Measurement and Evaluation>

Experimental Example 1

Measurement of Hydrogen Ion Concentration (pH)

While the composition for semiconductor processing prepared in each of the Examples and the Comparative Examples was stirred at 200 rpm at room temperature (20° C. to 25° C.), the hydrogen ion concentration (pH) thereof was measured using a pH measurement device (Horiba, Laqua). The results of the measurement are shown in Table 1 below.

Experimental Example 2

Measurement of Removal Rate

A copper film wafer having a thickness of about 20,000 Å, a silicon nitride film wafer having a thickness of about 12,000 Å, and a silicon oxide film wafer having a thickness of about 20,000 Å were prepared. As shown in FIG. 4, each wafer as a polishing target 130 was accommodated in a carrier 160 such that the polishing target surface thereof faced downward. A surface plate 120 having a polishing pad 110 (HD-319B, SKC) mounted thereon so that the polishing surface of the polishing pad faced upward was prepared. After the carrier 160 was placed on the polishing pad so that the polishing target surface and the polishing surface were in contact with each other, each of the components was operated for 60 seconds under the following conditions: the pressure under which the carrier 160 is pressed against the polishing surface: 3 psi; the rotation speed of the carrier 160: 120 rpm; and the rotation speed of the surface plate 120: 117 rpm. Polishing was performed while the composition for semiconductor processing prepared in each of the Examples and the Comparative Examples was applied to the polishing surface at a flow rate of 300 ml/min. At the same time, the polishing surface was processed by driving a conditioner 170 (SKC-CI45, Saesol Diamond Ind. Co., Ltd.) under conditions of a rotation speed of 250 rpm and a pressing pressure of 8 psi. The removal rate (Å/min) of each wafer was calculated by measuring the thickness of each wafer after polishing.

Experimental Example 3

Evaluation of Polishing Performance

A patterned wafer was prepared which includes a through silicon via 10 having: a via 11 having a total diameter (D1) of 6 μm; a conductive filling electrode 30 comprising copper and having a planar diameter (D2) of 5 μm; and a second silicon nitride layer 22 disposed outside the conductive filling electrode 30 to surround the conductive filling electrode 30 and having a planar thickness (T1) of 0.5 μm. As shown in FIG. 4, the patterned wafer as the polishing target 130 was accommodated in the carrier 160 so that the polishing target surface thereof faced downward. A surface plate 120 having a polishing pad 110 mounted thereon so that the polishing surface of the polishing pad faced upward was prepared. After the carrier 160 was placed on the polishing pad so that the polishing target surface and the polishing surface were in contact with each other, each of the components was operated for 60 seconds under the following conditions: the pressure under which the carrier 160 is pressed against the polishing surface: 3 psi; the rotation speed of the carrier 160: 120 rpm; and the rotation speed of the surface plate 120: 117 rpm. Polishing was performed while the composition for semiconductor processing prepared in each of the Examples and the Comparative Examples was applied to the polishing surface at a flow rate of 300 ml/min. After completion of the polishing, a cleaning process was performed at a brush rotation speed of 500 rpm for 60 seconds while spraying a cleaning solution at a spray rate of 2,000 cc/min. Subsequently, the diameter from the center to the end of the polishing target surface of the patterned wafer was divided into three equal regions, and a sample having a size of 1 cm×1 cm (width × length) was obtained from each region. Non-contact AFM analysis of each sample was performed using an AFM analysis system (NX-20, Park System). The analysis was performed under conditions of a specific analysis area of 80 μm×80 μm (width×length) and a tip profiling scan rate of 8 μm/s.

For each Example, the degree of dishing on the conductive filling electrode 30 was taken as a (+) value in a planar direction in which the dishing occurred, and the results are shown in Table 1 below. That is, the (−) value in Table 1 below indicates the degree of protrusion.

In addition, for each Example, when the height of the second silicon nitride layer 22 from the surface of the silicon oxide layer 40 as a reference surface exceeded 2 μm, it was evaluated that a SiN round error occurred. According to this criterion, the occurrence (O) or non-occurrence (X) of the SiN round error was evaluated, and the results of the evaluation are shown in Table 1 below. In addition, images and cross-sectional profile graphs of the polishing target surfaces polished with each of the compositions for semiconductor processing according to Examples 1 and 6 and Comparative Examples 2 and 4 were obtained using an atomic force microscope (AFM), and are shown in FIGS. 5-8. Specifically, FIG. 5 shows photographs and cross-sectional profile graphs of polishing target surfaces polished using compositions for semiconductor processing according to Example 1. FIG. 6 shows photographs and cross-sectional profile graphs of polishing target surfaces polished using compositions for semiconductor processing according to Example 6. FIG. 7 shows photographs and cross-sectional profile graphs of polishing target surfaces polished using compositions for semiconductor processing according to Comparative Example 2. FIG. 8 shows photographs and cross-sectional profile graphs of polishing target surfaces polished using compositions for semiconductor processing according to Comparative Example 4.

TABLE 1

| | | Example 1 | Example 2 | Example 3 | Example 4 | Example 5 | Example 6 | Comp. Example 1 | Comp. Example 2 | Comp. Example 3 | Comp. Example 4 |
|---|---|---|---|---|---|---|---|---|---|---|---|
| Composition [parts by weight] | Silica (A) | 100.000 | 100.000 | 100.000 | 100.000 | 100.000 | 100.000 | 100.000 | 100.000 | 100.000 | 100.000 |
| | Glycine (B) | 2.000 | 1.333 | 2.667 | — | 1.667 | 1.000 | 2.000 | 3.333 | 2.000 | 3.333 |
| | EDTA (F) | — | — | — | 3.000 | — | — | — | — | — | — |
| | Azole based compound (C) | 0.333 | 0.267 | 0.400 | 0.333 | 0.278 | 0.333 | 0.333 | 0.333 | 0.333 | 0.333 |
| | Phosphoric acid based compound (D) | 0.013 | 0.017 | 0.020 | 0.013 | 0.011 | 0.013 | 0.013 | 0.013 | 0.007 | 0.007 |
| | Fluorine based compound (E) | 0.013 | 0.013 | 0.013 | — | 0.011 | 0.013 | 0.013 | 0.013 | 0.013 | 0.013 |
| Weight ratio | B:C | 6.0:1 | 5.0:1 | 6.7:1 | — | 6.0:1 | 3.0:1 | 6.0:1 | 10.0:1 | 6.0:1 | 10.0:1 |
| | F:C | — | — | — | 9.0:1 | — | — | — | — | — | — |
| | (B + C):D | 100:0.57 | 100:1.04 | 100:0.65 | — | 100:0.57 | 100:1.00 | 100:0.57 | 100:0.36 | 100:0.29 | 100:0.18 |
| | (F + C):D | — | — | — | 100:0.39 | — | — | — | — | — | — |
| pH | | 4 | 4 | 4 | 4 | 4 | 4 | 4 | 4 | 4 | 4 |
| Removal | Silicon | 3341 | 3145 | 3024 | 3140 | 4878 | 3299 | 414 | 3198 | 3315 | 3291 |

TABLE 1-continued

|  |  | Example 1 | Example 2 | Example 3 | Example 4 | Example 5 | Example 6 | Comp. Example 1 | Comp. Example 2 | Comp. Example 3 | Comp. Example 4 |
|---|---|---|---|---|---|---|---|---|---|---|---|
| rate [Å/min] | oxide film ($R_O$) |  |  |  |  |  |  |  |  |  |  |
|  | Silicon nitride film ($R_N$) | 2031 | 2415 | 2235 | 460 | 2741 | 2015 | 1834 | 1942 | 1032 | 1235 |
|  | Copper film ($R_{Cu}$) | 2652 | 2413 | 2652 | 490 | 2933 | 1238 | 2981 | 3667 | 2641 | 3248 |
| Ratio of removal rates | $R_O/R_{Cu}$ (value according to Equation 3) | 1.260 | 1.303 | 1.140 | 6.408 | 1.663 | 2.665 | 0.139 | 0.872 | 1.255 | 1.013 |
|  | $R_N/R_{Cu}$ | 0.766 | 1.001 | 0.843 | 0.939 | 0.935 | 1.628 | 0.615 | 0.530 | 0.391 | 0.380 |
|  | $R_O/R_N$ (value according to Equation 2) | 1.645 | 1.302 | 1.353 | 6.826 | 1.780 | 1.637 | 0.226 | 1.647 | 3.212 | 2.665 |
| Value calculated according to Equation 1 |  | 57.0 | 31.4 | 42.6 | 35.6 | 55.9 | 12.5 | 10.9 | 114.0 | 217.1 | 227.6 |
| Cu dishing/Protrusion |  | 4 nm | 8 nm | 3 nm | 0 nm | −34 nm | −16 nm | 90 nm or more | 58 nm | 11 nm | 62 nm |
| SiN Round Error |  | X | X | X | X | ○ | ○ | X | X | ○ | ○ |

Referring to Table 1 above, it could be confirmed that, in the case of the compositions for semiconductor processing according to Examples 1 to 6, the value calculated according to Equation 1 satisfied the range of greater than about 11.0 to less than or equal to about 110.0, and in the actual process of polishing the patterned wafer having the TSV structure by using each of the compositions, the dishing value of the conductive filling electrode including copper satisfied a value of less than 15 nm, specifically less than 10 nm, which is within the range specified in the present invention.

More specifically, it was shown that, when each of the compositions for semiconductor processing according to Examples 1 to 6 was applied, the dishing and/or protrusion value of the conductive filling electrode including copper was less than about 15 nm to not less than about −50 nm, specifically, less than about 10 nm to not less than about −40 nm. The conductive filling electrode including copper functions to perform vertical electrical connection in a three-dimensional patterned wafer, and if dishing or protrusion in polishing is excessive, it may be difficult for the conductive filling electrode to perform this function. At this time, in terms of causing a fatal error in the achievement of this function, excessive dishing may be more disadvantageous than certain protrusion because it completely blocks the vertical electrical connection. That is, the compositions for semiconductor processing according to Examples 4 and 5 exhibit the polishing performance corresponding to the value of Equation 1 that satisfies the specified range, and thus these compositions may produce better results in terms of implementation of the TSV function than the compositions for semiconductor processing according to Comparative Examples 1 to 4, which cause excessive dishing and certain protrusion.

More specifically, it could be confirmed that, in the case of the compositions for semiconductor processing of Examples 1 to 4, the value of Equation 1 satisfied the range of about 30.0 to about 60.0, and thus these compositions exhibited polishing performance corresponding to a dishing and/or protrusion value of about −10 nm to less than about 10 nm, specifically, about −5 nm to less than about 10 nm, in the conductive filling electrode including copper, suggesting that these compositions exhibited improved polishing performance without substantially causing excessive dishing or protrusion.

On the contrary, it could be confirmed that, in the case of the composition for semiconductor processing according to Comparative Example 1, the value of Equation 1 was 11.0 or less, and the dishing value of the conductive filling electrode significantly decreased to a level of about 90 nm or more, suggesting that the composition of Comparative Example 1 exhibited very poor polishing performance.

In addition, it could be confirmed that, in the case of the compositions for semiconductor processing according to Comparative Examples 2 to 4, the value of Equation 1 was greater than 110.0, and the dishing value of the conductor filling electrode was greater than about 10 nm, more specifically, about 50 nm or more, suggesting that it was not possible to achieve the desired level of flatness.

Meanwhile, it could be confirmed that, in the case of the compositions for semiconductor processing according to Examples 1 to 4, the value of Equation 1 satisfied the range of about 30.0 to 60.0, and thus these compositions exhibited excellent results in terms of dishing and protrusion of the conductive filling electrode, and at the same time, the SiN round error of the second silicon nitride layer 22 also did not occur.

On the contrary, it could be confirmed that, in the case of the compositions for semiconductor processing according to Comparative Examples 1 and 2, the SiN round error did not occur, but there was a problem in that excessive dishing of the conductive filling electrode occurred, and in the case of the comparisons for semiconductor processing according to Comparative Examples 3 to 4, excessive dishing of the conductive charging electrode occurred and, at the same time, the SiN round error also occurred.

What is claimed is:

1. A composition for semiconductor processing containing:
abrasive particles surface-modified with a silane composition; and at least one additive, and being for application to polishing of a surface of a semiconductor wafer having a through silicon via (TSV),
wherein the at least one additive includes a phosphoric acid-based compound, an organic acid and an azole-based compound, and
the total weight of the phosphoric acid-based compound is 0.35 parts by weight to about 2.00 parts by weight based on 100 parts by weight of the total weight of the organic acid and the azole-based compound, wherein the abrasive particles comprise silica ($SiO_2$), wherein a ratio of $R_N$ to $R_{Cu}$ ($R_N/R_{Cu}$) for the composition for semiconductor processing is greater than about 0.50 to less than or equal to about 2.00, wherein the value calculated according to Equation 1 for the composition for semiconductor processing is greater than 11.0 to less than or equal to 110.0:

$$\left(\frac{R_{Cu}}{R_N}\right)^2 \times \frac{R_O}{100} \quad \text{[Equation 1]}$$

wherein $R_O$ is the removal rate (Å/min) of a silicon oxide layer during polishing using the composition for semiconductor processing, $R_N$ is the removal rate (Å/min) of a silicon nitride layer during polishing using the composition for semiconductor processing, and $R_{Cu}$ is the removal rate (Å/min) of a copper layer during polishing using the composition for semiconductor processing; and each of the removal rate of the silicon oxide layer, the removal rate of the silicon nitride layer, and the removal rate of the copper layer is a value obtained by performing polishing on a wafer having each of the layers for 60 seconds under conditions of a carrier pressing pressure of 3.0 psi, a carrier rotation speed of 120 rpm and a surface plate rotation speed of 117 rpm while supplying the composition for semiconductor processing at a flow rate of 300 mL/min.

2. The composition of claim 1, wherein a value calculated according to Equation 2 below is greater than 0.50 and less than or equal to 7.00:

$$\frac{R_O}{R_N}. \quad \text{[Equation 2]}$$

3. The composition of claim 2, wherein $R_O$ is 500 Å/min to 5,000 Å/min.

4. The composition of claim 2, wherein $R_N$ is 400 Å/min to 3,000 Å/min.

5. The composition of claim 2, wherein a value calculated according to Equation 3 below is greater than 1.00 and less than or equal to 7.00:

$$\frac{R_O}{R_{Cu}}. \quad \text{[Equation 3]}$$

6. The composition of claim 5, wherein $R_{Cu}$ is 400 Å/min to 3,500 Å/min.

7. The composition of claim 1, wherein a weight ratio of the organic acid to the azole-based compound is greater than and equal to 3:1 and less than 10:1.

8. The composition of claim 1, wherein the organic acid is contained in an amount of 0.5 to 6 parts by weight based on 100 parts by weight of the abrasive particles.

9. The composition of claim 1 having a pH 2 to 5.

10. The composition of claim 1, wherein the abrasive particles further comprise one selected from the group consisting of ceria ($CeO_2$), alumina ($Al_2O_3$), zirconia ($ZrO_2$), and combinations thereof.

11. The composition of claim 1, wherein the abrasive particles in the composition comprise particles surface-treated so that a zeta potential of the abrasive particles has a positive (+) value.

12. The composition of claim 1, wherein the abrasive particles comprise particles surface-treated with at least one organic component selected from the group consisting of amino silane, alkoxy silane, ethoxy silane, epoxy silane, and combinations thereof.

13. The composition of claim 1, wherein the abrasive particles have a value of 1.10 to 1.80 as calculated according to Equation 4 below:

$$D90/D10 \quad \text{[Equation 4]}$$

wherein D90 is a 90% cumulative mass particle size distribution diameter in a particle size distribution of the abrasive particles, and D10 is a 10% cumulative mass particle size distribution diameter in the particle size distribution of the abrasive particles.

* * * * *